(12) United States Patent
Kohl et al.

(10) Patent No.: US 6,728,021 B1
(45) Date of Patent: Apr. 27, 2004

(54) OPTICAL COMPONENT AND METHOD OF INDUCING A DESIRED ALTERATION OF AN OPTICAL PROPERTY THEREIN

(75) Inventors: Alexander Kohl, Aalen (DE); Hubert Holderer, Königsbronn (DE)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 10/299,032

(22) Filed: Nov. 18, 2002

(51) Int. Cl.[7] ............................. G02F 1/03; A61N 5/00
(52) U.S. Cl. ..................... 359/256; 359/252; 359/245; 359/244; 250/492.3
(58) Field of Search .................. 359/256, 252, 359/245, 244, 640; 250/559.4, 492.3

(56) References Cited

U.S. PATENT DOCUMENTS 5,039,867 A * 8/1991 Nishihara et al. ........ 250/492.3
6,522,456 B2 * 2/2003 Chen et al. ................. 359/322

* cited by examiner

*Primary Examiner*—Loha Ben
*Assistant Examiner*—Jack Dinh
(74) *Attorney, Agent, or Firm*—Factor & Lake

(57) ABSTRACT

High precision optical components, for example $CaF_2$ lenses in lithographic systems for the production of integrated circuits, often suffer from stress induced birefringence and other imperfections. For altering the optical properties in a confined region of the optical component, the latter is exposed to a beam of ions having an energy preferably in the order 100 MeV/u. This results in a modification of the optical properties due to an interaction of the ions with the surrounding medium the optical component consists of. By carefully choosing the parameters of the process, it is possible to alter the refractive index or the mechanical stress distribution or other optical properties within a confined region of this medium.

14 Claims, 1 Drawing Sheet

OPTICAL COMPONENT AND METHOD OF INDUCING A DESIRED ALTERATION OF AN OPTICAL PROPERTY THEREIN

FIELD OF THE INVENTION

The invention relates to an optical component comprising a transmissive optical medium, and to a method of inducing a desired alteration of an optical property of such an optical component.

BACKGROUND OF THE INVENTION

Optical lithography has become a key technology for the fabrication of electrical and optical integrated circuits. Since the smallness of such circuits is mainly determined by the imaging systems of the lithographic devices used in the fabrication process, considerable efforts have been spent on improving the resolution of these imaging systems.

One way to achieve higher imaging resolutions in such systems is to use shorter wavelengths. At present, research and development activities focus on devices that use UV light having a wavelength of 157 nm. Such extremely short wavelengths require transmissive optical components, such as lenses or compensators, that are made of very specific materials, for example calciumfluorid ($CaF_2$) crystals, since conventional fused silica is almost opaque for such short wavelengths. However, the use of those materials poses new problems that are intrinsically coupled with their optical properties.

One of the particular problems that are encountered when $CaF_2$ crystals are used is the physical effect of birefringence. The term birefringence refers to the dependence of the refractive index on the polarisation direction. If an unpolarized light beam impinges on a birefringing material, the incoming beam will be split up into two beams with different polarisations. The type of birefringence that is caused by the crystal structure as such is commonly referred to as intrinsic birefringence. Typically, this intrinsic birefringence is compensated by carefully choosing the crystal orientation of successive lenses within the imaging system.

Birefringence, however, may also be caused by mechanical stress within the crystal. Mechanical stress may be a result of poor crystal growth conditions or may be caused by lens holders or the like that exert a pressure on the crystal. Since the mechanical stress distribution within the crystals cannot be easily predicted in advance, compensation of stress induced birefringence is extremely difficult.

It is therefore an object of the invention to provide a method of inducing a desired alteration of an optical property, in particular of stress induced birefringence, of an optical component comprising a transmissive optical medium.

SUMMARY OF THE INVENTION

This object is solved, according to the present invention, in that such a method includes the step of exposing at least a region of the medium to a beam of ions having an energy of at least 100 keV so that the optical property is altered at least in a part of the region due to an interaction between the ions and the medium.

It is generally known in the art that optical components used in nuclear, space and high-energy physics severely suffer from radiation-induced performance degradation, see for example a paper by Johan van der Linden entitled "Researchers compile radiation data base" in Opto+Laser Europe (OLE), February 2002, issue 92, page 24–25. There it is described that exposure to particle radiation, such as proton and neutron beams, can cause displacement damage within optical materials, whereas exposure to electromagnetic radiation, such as gamma rays, will primarily induce defects resulting from ionisation.

The present invention, however, is based on the surprising finding that the exposure to particle radiation may be advantageously exploited for altering and adjusting optical properties of optical components if (heavy) ions with an energy of more than 100 kev per nucleon (100 kev/u), preferably an energy in the range between 90 MeV/u and 110 MeV/u, are used as projectiles. Since such ion beams lose, according to the Bethe-Bloch-formula, almost all their energy in the last few millimeters before their motion is finally stopped in the material, the interaction of the incoming ions with the optical medium is also restricted to a very short distance along the propagation direction of the beam. It is thus possible to control and direct the interaction between the ions and the optical medium, and thus the alteration of optical properties, to a spatially confined region within the optical medium. Incidentally, this property of heavy ion beams is also exploited in the radiotherapy of deep seated tumors.

Preferably the optical component and the ion beam are moved relatively to each other in at least one direction that is distinct from the propagation direction of the beam. This allows to confine the region where the optical property is altered not only to a point or small sphere, but to a (curved) area within the optical medium. Since the penetration depth is, according to the Bethe-Bloch-formula, only a function of ion energy, any inclination of the ion beam with respect to the optical medium will result in a curved interaction area. Such an inclination of the ion beam may be accomplished by fast magnetic deflection as is principally known, for example, from TV sets. Any lateral translation between an ion beam source and the optical medium, as can be achieved by a x-y-handling system, for example, will result in a plane interaction area.

By varying the energy of the ions during the exposure of the region it is possible to control the penetration depth of the ions so that, if combined with a relative movement between the optical medium and the ion beam, a three dimensional region of arbitrary geometry may be "written" by the ion beam so that the desired alteration of the optical properties can be spatially controlled in a very precise manner.

By varying the number of ions to which the region within the optical medium is exposed, it is possible to control the degree of the optical property alterations that are induced by the interactions between the ions and the optical medium.

The kind and strength of interaction is, of course, not only determined by the number of ions but also by the type of ions used for the exposure and also by the structural properties of the optical medium. For example, crystalline materials such as calciumfluoride are more sensible to ion beam exposure than amorphous media, for example silica glass. In general, it is possible to determine the optical property to be altered by carefully selecting the type of ions to which the optical medium is exposed. Ions of the type that is used for the ion beam may be already present within the medium. In the case of $CaF_2$ lenses, for example, calcium or fluoride ions may be implanted into the crystal. However, it is also possible to implant different ions as a kind of dopant.

The ions may be chosen, for example, such that a change of the mechanical stress distribution is caused within the portion of the medium that has been exposed to the ion beam. Such a mechanical stress redistribution is mainly caused by the implantation of additional ions within the material. Also structural modifications along the penetration path of the ions within the medium have an influence on to the stress distribution within the material.

By carefully choosing the type of ions used and controlling the process of exposure it is thus possible either to achieve a reduction of the mechanical stress—and thus stress induced birefringence—within the optical medium, or to introduce additional stress within the optical medium. The latter may be useful, for example, if the optical component is designed as a correcting element that compensates birefringence of another optical component within the system.

By carefully choosing the ions it is also possible to selectively cause a local refractive index change within the optical medium. This effect may be used, for example, for transforming an originally spherical lens into an effectively "aspherical" lens by altering the refractive index of the lens material by ion beam exposure in such a way that the processed lens has the same optical properties as an aspherical lens. This leads to a considerable cost reduction and is applicable not only in lithographic devices, but also in other technical fields in which optical components are used, for example photography or microscopy.

In another preferred embodiment the ions are optically absorptive at least for a range of transmitting light wavelengthes of the medium. Such implanted ions result in increased energy absorption and thereby to a local rise in temperature within the optical medium. Such optical elements may, for example, be used for compensating lens heating effects.

DETAILED DESCRIPTION OF THE DRAWINGS

The above and other advantages of the present invention will become apparent from the following description of a preferred embodiment given in conjunction with the accompanying drawings, in which.

Figure 1:
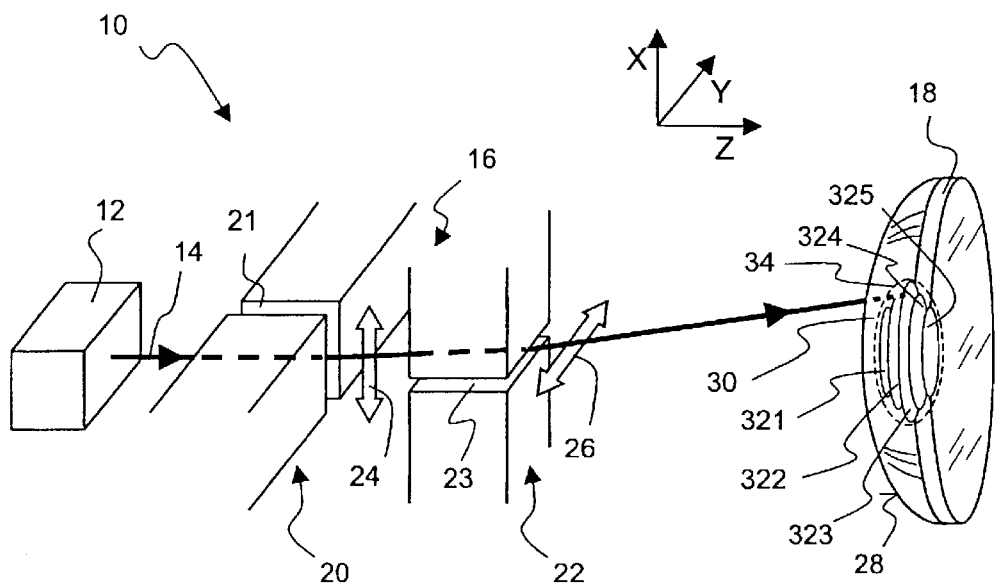
FIG. 1 shows a schematic illustration of an exposure system for exposing an optical element to a beam of ions according to the present invention.

An exposing system that is suited for precisely directing an ion beam onto an optical component is schematically shown in FIG. 1 and designated in its entirety by 10.

Exposing system 10 comprises an ion beam source 12 that allows to control the number of emitted ions and may be realized as a linear accellerator for heavy ions. Such ion beam sources are generally known in the art and will not be described in further detail as such. Ion beam source 12 emits an ion beam 14 that consists of a flux of fluoride ions having substantially the same energy $E_0$ of approximately 100 MeV/u.

Ion beam 14 is directed, via a magnetic deflection system 16, to an optical element 18 which is, in the embodiment shown, a planar convex lens that is made of a calciumfluorid (CaF$_2$) crystal. Optical element 18 comprises a region in which stress induced birefringence shall be reduced. Magnetic deflection system 16 comprises a first and a second pair of magnetic poles 20 and 22, respectively, having an orthogonal relative orientation and defining gaps 21 and 23 between each pair 20, 22. Magnetic poles are implemented by electromagnets. Each pair of magnetic poles 20, 22 generates a magnetic flux which exerts a force on the ions passing through gaps 21 and 23, respectively. The force exerted onto the ions results in a deflection of the beam, the direction of which being in the X- and the Y-direction, as indicated by arrows 24 and 26, respectively. It is thus possible to control the direction of ion beam 14 by voltages applied to the electromagnets of each pair of magnetic poles 20 and 22.

After having been deflected by deflection system 16, ion beam 14 impinges onto a surface 28 of optical component 18 and penetrates into optical medium 30 that is confined by surface 28.

Figure 2:
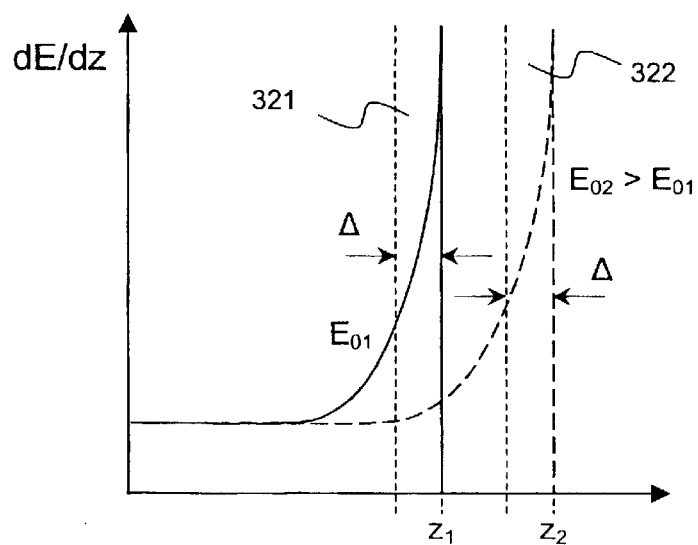
FIG. 2 is a graph showing the energy loss profile of ions within an optical medium as a function of the propagation distance for different ion energies.

Since ions with high energy interact only weakly with surrounding optical medium 30, ion beam 14 will, after having penetrated surface 28, initially propagate almost unimpeded through optical medium 30. This is illustrated in the graph of FIG. 2 that shows the energy loss profile dE/dz of ions for different source energies $E_{01}$ and $E_{02}>E_{01}$ as a function of propagation distance z in optical medium 30. As can be seen in this graph, significant energy loss—and therefore interaction with surrounding medium 30—is confined to small interaction zones 321 and 322 of depths in front of stop points $z_1$ and $z_2$, respectively, for different source energies $E_{01}$ and $E_{02}$. It can also be seen that higher source energies $E_0$ only result in a shift of the interaction zones further into the medium, but not to a significant difference between the loss profiles as such.

Since optical medium 30 is substantially modified only in the interaction zones 321 and 322, it is possible to confine the interaction region within optical medium 30 in the Z-direction by carefully controlling the ion beam source energy $E_0$. If this energy is smoothly varied, the interaction zone can be continuously shifted in the Z-direction. This is schematically indicated in FIG. 1 by distinct interaction zones 321, 322, . . . , 325.

By simultaneously controlling source energy $E_0$ of ion beam 14 on the one hand and the magnetic fields generated by the two pairs of magnetic poles 20 and 22 on the other hand, it is thus possible to cause a significant physical interaction between ions and the surrounding material at any arbitrary point within optical medium 30. In the embodiment shown this interaction is confined to a three dimensional portion 34 as schematically indicated in FIG. 1 by a broken line in which stress induced birefringence shall be reduced. It is, however, also possible to introduce such interaction, for example, homogeneously distributed over the entire optical medium 30.

The strength of the interaction within an interaction zone is determined by the number of ions that suffer an energy loss within that zone. Thus the strength of the interaction, and therefore the degree of the alteration of the optical properties in this zone, can be manipulated by controlling the duration during which the interaction zone is exposed to ion beam 14. Alternatively, the number of ions emitted by ion beam source 12 may be controlled so as to cause interactions of different strength while maintaining a continuous movement of ion beam 14 in the X- and Y-direction.

It is to be understood that many modifications of the exposing system 10 as described above are possible and within the scope of the invention. For example, magnetic deflection system 16 could be replaced by an electric deflection system in which the ions are deflected by electrical fields, or by a precision handling system for optical component 18 that allows to move the latter in the X- and Y-direction.

What is claimed is:

1. Method of inducing a desired alteration of an optical property of an optical component comprising a transmissive optical medium, said method including the step of exposing at least a region of said medium to a beam of ions having an energy of at least 100 keV/u so that said optical property is altered at least in a part of said region due to an interaction between said ions and said medium.

2. The method of claim 1, including the step of moving, during the exposure of said region to said beam, said component and said beam relatively to each other in at least one direction that is distinct from the propagation direction of said beam.

3. The method of claim 1, comprising the step of varying the energy of said ions during the exposure of said region to said beam.

4. The method of claim 1, comprising the step of varying the number of said ions to which said region is exposed.

5. The method of claim 1, in which said ions are chosen such that a change of the mechanical stress distribution is caused within said part of said medium.

6. The method of claim 5, in which said ions are chosen such that a reduction of mechanical stress is caused within said part of said medium.

7. The method of claim 1, in which said ions are chosen such that a refractive index change is caused within said part of said medium.

8. The method of claim 1, in which said ions are optically absorptive at least for a range of transmitting wavelengths of said medium.

9. The method of claim 1, in which said ions have an energy in the range between 90 MeV/u and 110 MeV/u.

10. Optical component, comprising a transmissive optical medium, said medium having a portion in which an optical property that has originally been present has been altered by exposing at least a region of said medium to a beam of ions having an energy of at least 100 keV/u so that said optical property has been altered in said portion within said region due to an interaction between said ions and said medium.

11. The component of claim 10, in which said portion has a three-dimensional shape.

12. The component of claim 10, in which said altered optical property is the refractive index of said medium.

13. The component of claim 10, in which said altered optical property is the mechanical stress distribution within said medium.

14. The component of claim 10, comprising ions that have been introduced by said beam of ions and are optically absorptive at least for a range of transmitting light wavelengths of said medium.

\* \* \* \* \*